(12) United States Patent
Mishima et al.

(10) Patent No.: US 10,944,017 B2
(45) Date of Patent: Mar. 9, 2021

(54) STACKED PHOTOELECTRIC CONVERSION DEVICE AND METHOD FOR PRODUCING SAME

(71) Applicant: KANEKA CORPORATION, Osaka (JP)

(72) Inventors: Ryota Mishima, Osaka (JP); Masashi Hino, Osaka (JP); Tomomi Meguro, Osaka (JP)

(73) Assignee: KANEKA CORPORATION, Osaka (JP)

( * ) Notice: Subject to any disclaimer, the term of this patent is extended or adjusted under 35 U.S.C. 154(b) by 78 days.

(21) Appl. No.: 16/186,069

(22) Filed: Nov. 9, 2018

(65) Prior Publication Data
US 2019/0081189 A1    Mar. 14, 2019

Related U.S. Application Data

(63) Continuation of application No. PCT/JP2017/017356, filed on May 8, 2017.

(30) Foreign Application Priority Data

May 9, 2016  (JP) .............................. JP2016-094106

(51) Int. Cl.
*H01L 31/0224*    (2006.01)
*H01L 31/0236*    (2006.01)
(Continued)

(52) U.S. Cl.
CPC .... *H01L 31/022425* (2013.01); *H01L 31/028* (2013.01); *H01L 31/0224* (2013.01);
(Continued)

(58) Field of Classification Search
CPC combination set(s) only.
See application file for complete search history.

(56) References Cited

U.S. PATENT DOCUMENTS

2003/0044539 A1 * 3/2003 Oswald ............. H01L 31/03921
427/404
2003/0111106 A1    6/2003 Nagano et al.
(Continued)

FOREIGN PATENT DOCUMENTS

EP    3308401 A1    4/2018
EP    3308412 A1    4/2018
(Continued)

OTHER PUBLICATIONS

H. Kanda et al., "Perovskite/Crystal Silicon Tandem Solar Cell", The 62nd Japan Society of Applied Physics (JSAP) spring meeting proceeding, The Japan society of Applied Physics, Mar. 11, 2015, p. 12p-P7-34 (1 page).
(Continued)

*Primary Examiner* — Nduka E Ojeh
(74) *Attorney, Agent, or Firm* — Osha Bergman Wantanabe & Burton LLP

(57) ABSTRACT

A method for manufacturing a stacked photoelectric conversion device includes forming an intermediate transparent conductive layer on a light-receiving surface of a crystalline silicon-based photoelectric conversion unit including a crystalline silicon substrate, and forming a thin-film photoelectric conversion unit on the intermediate transparent conductive layer. The stacked photoelectric conversion device includes the crystalline silicon-based photoelectric conversion unit, the intermediate transparent conductive layer, and the thin-film photoelectric conversion unit. The light-receiving surface of the crystalline silicon-based photoelectric conversion unit has a textured surface including a plurality of projections and recesses. The textured surface has an average height of 0.5 μm or more. The intermediate transparent conductive layer fills the recesses of the textured surface and covers the tops of the projections of the textured
(Continued)

surface. At least a part of the thin-film photoelectric conversion unit is deposited by a wet method.

16 Claims, 6 Drawing Sheets

(51) Int. Cl.
  *H01L 51/44* (2006.01)
  *H01L 31/028* (2006.01)
  *H01L 31/18* (2006.01)

(52) U.S. Cl.
  CPC .... *H01L 31/0236* (2013.01); *H01L 31/02363* (2013.01); *H01L 31/022483* (2013.01); *H01L 31/1804* (2013.01); *H01L 31/1888* (2013.01); *H01L 51/44* (2013.01); *Y02E 10/549* (2013.01); *Y02P 70/50* (2015.11)

(56) References Cited

U.S. PATENT DOCUMENTS

| | | | |
|---|---|---|---|
| 2009/0229663 A1* | 9/2009 | Appadurai | H01L 31/022466 136/261 |
| 2011/0146755 A1* | 6/2011 | Curran | H01L 27/302 136/246 |
| 2011/0290322 A1* | 12/2011 | Meguro | H01L 31/0745 136/256 |
| 2012/0145239 A1* | 6/2012 | Kunii | C23C 16/52 136/258 |
| 2013/0048071 A1* | 2/2013 | Lombardo | H01L 31/202 136/256 |
| 2014/0242746 A1* | 8/2014 | Albadri | H01L 31/0747 438/94 |
| 2018/0174761 A1* | 6/2018 | Kamino | H01L 51/4226 |
| 2018/0226529 A1* | 8/2018 | Uzu | H01L 31/0725 |

FOREIGN PATENT DOCUMENTS

| | | |
|---|---|---|
| JP | 2002-319688 A | 10/2002 |
| JP | 2003-069061 A | 3/2003 |
| JP | 2009016179 A | 1/2009 |
| JP | 2011222589 A | 11/2011 |
| JP | 2013-173082 A | 9/2013 |
| JP | 2014-239150 A | 12/2014 |
| WO | 2015/017885 A1 | 2/2015 |

OTHER PUBLICATIONS

S. Albrecht et al., "Monolithic perovskite/silicon-heterojunction tandem solar cells processed at low temperature", Royal Society of Chemistry, Energy & Environmental Science, vol. 9, Issue 1, 2016, pp. 81-88 (8 pages).
J. P. Mailoa et al., "A 2-terminal perovskite/silicon multijunction solar cell enabled by a silicon tunnel junction", Applied Physics Letters, vol. 106, 2015, pp. 121105-1-121105-4 (5 pages).
International Search Report issued in International Application No. PCT/JP2017/017356, dated Jun. 20, 2017 (2 pages).
Office Action issued in corresponding Japanese Application No. 2018-516996; dated Sep. 10, 2019 (4 pages).
International Report on Patentability issued in International Application No. PCT/JP2017/017356; dated Nov. 22, 2018 (6 pages).
M. Filipič et al., "CH3NH3PbI3 perovskite / silicon tandem solar cells: characterization based optical simulations", Optics Express, vol. 23, No. 7, pp. 4479-4486; Apr. 6, 2015 (16 pages).
Office Action issued in corresponding Japanese Application No. 2018-516996, dated Dec. 3, 2019 (4 pages).
Extended European Search Report issued in corresponding European Application No. 17796083.8, dated Nov. 27, 2019 (12 pages).

* cited by examiner

Reference Example 1

Reference Example 2

Reference Example 3

Before RIE

After RIE

Deposition Surface

Cross section

STACKED PHOTOELECTRIC CONVERSION DEVICE AND METHOD FOR PRODUCING SAME

TECHNICAL FIELD

One or more embodiments of the present invention relate to a stacked photoelectric conversion device in which a crystalline silicon-based photoelectric conversion unit including crystalline silicon substrate and a thin-film photoelectric conversion unit are stacked, and a method for manufacturing the stacked photoelectric conversion device.

BACKGROUND

A crystalline silicon-based solar cell includes a p-type semiconductor layer on one surface of a crystalline silicon substrate and an n-type semiconductor layer on the other surface of the crystalline silicon substrate. A stacked solar cell has been proposed in which a photoelectric conversion unit including a light absorbing layer having a bandgap different from that of crystalline silicon is disposed on a crystalline silicon-based solar cell to establish multi-junction, so that light utilization efficiency is improved.

For example, Non-Patent Document 1 discloses a stacked photoelectric conversion device in which an n-type silicon thin-film as a tunnel junction layer is disposed on a diffusion-type crystalline silicon bottom cell with a p-type diffusion layer disposed on a surface of a crystalline silicon substrate, and thereon, a perovskite photoelectric conversion unit as a top cell is formed with a titanium oxide layer interposed therebetween, the titanium oxide layer serving as an electron transport layer. Non-Patent Document 2 discloses a stacked photoelectric conversion device in which a 80 nm-thick ITO layer and a 15 nm-thick tin oxide layer are disposed on a heterojunction-type crystalline silicon bottom cell including an intrinsic amorphous silicon thin-film and a p-type amorphous silicon thin-film on a surface of a crystalline silicon substrate, and thereon, a perovskite photoelectric conversion unit including a perovskite-type crystal material layer and a spiro-OMETAD layer as a hole transport layer is formed as a top cell.

A perovskite cell used for the top cell of the stacked photoelectric conversion device in each of Non-Patent Document 1 and Non-Patent Document 2 includes a perovskite-type crystal material layer as a light absorbing layer, and is capable of attaining high conversion efficiency. On the other hand, the perovskite-type crystal material has a spectral sensitivity characteristic at wavelength shorter than 800 nm, and hardly absorbs infrared light having a wavelength longer than 800 nm. When a crystalline silicon cell capable of absorbing light having a long wavelength is combined with a perovskite cell, it is possible to make current matching between a top cell and bottom cell, and therefore it is expected to obtain a high-efficiency stacked photoelectric conversion device.

PRIOR ART DOCUMENTS

Non-Patent Document 1: Steve Albrecht et. al., *Energy Environ. Si* 9, 81-88 (2016).
Non-Patent Document 2: Jonathan P Mailoa et. al, *Appl. Phys. Lett.* 106, 121105 (2015).

In a general single cell using a crystalline silicon substrate, a texture having a morphology height of about 0.5 to 10 μm is formed on a surface of the crystalline silicon substrate for reducing light reflection and increasing the amount of light captured in the silicon substrate. In a perovskite cell, generally a perovskite-type crystal material layer as a light absorbing layer and a charge transport layer disposed on and under the perovskite-type crystal material layer are formed by a wet method.

Formation of a thin-film cell such as a perovskite cell requires a substrate serving as a base for formation of a thin-film. For forming junction between a crystalline silicon cell using a crystalline silicon substrate and a thin-film cell, it is necessary to form a thin-film cell (thin-film photoelectric conversion unit) by depositing a thin film on the crystalline silicon cell with a crystalline silicon cell as a base.

The thickness of a thin-film photoelectric conversion unit is generally about 50 to 1000 nm, and therefore when a texture is provided on a surface of a silicon substrate, projections of the texture are not covered with the thin-film, and thus a deposition failure occurs. In Non-Patent Document 1 and Non-Patent Document 2, a perovskite-type crystal material layer and a charge transport layer are formed by a wet method on a crystalline silicon cell using a crystalline silicon substrate which is smooth and has no textured structure on the light-receiving side. Thus, due to light reflection at a light-receiving surface of the crystalline silicon substrate, light is not sufficiently captured in the silicon substrate, the photocurrent in the crystalline silicon cell is small, and therefore the benefits of multi-junction cannot be sufficiently utilized.

SUMMARY

In view of the situations described above, one or more embodiments of the present invention provide a stacked photoelectric conversion device having a favorable thin-film coverage even when a thin-film photoelectric conversion unit is formed by a wet method on a crystalline silicon-based photoelectric conversion unit using a silicon substrate with a texture being formed on a light-receiving surface.

One or more embodiments of the present invention relate to a stacked photoelectric conversion device including a thin-film photoelectric conversion unit on a crystalline silicon-based photoelectric conversion unit containing a crystalline silicon substrate, and a method for manufacturing the stacked photoelectric conversion device. In one or more embodiments, an intermediate transparent conductive layer is formed on the light-receiving surface of the crystalline silicon-based photoelectric conversion unit, and the thin-film photoelectric conversion unit is formed thereon. In some embodiments at least a part of the thin-film photoelectric conversion unit is deposited by a wet method. Examples of the thin-film photoelectric conversion unit that is formed by a wet method include perovskite photoelectric conversion units containing a perovskite-type crystal material.

In one or more embodiments, the light-receiving surface of the crystalline silicon-based photoelectric conversion unit is provided with a texture having an average morphology height of 0.5 μm or more, and the intermediate transparent conductive layer is disposed to so as to fill recesses of the texture and cover the tops of projections of the texture on the light-receiving surface of the crystalline silicon-based photoelectric conversion unit. The average morphology height of the light-receiving surface of the crystalline silicon-based photoelectric conversion unit may be 2 μm or less.

The intermediate transparent conductive layer of one or more embodiments may be disposed in such a manner that the average morphology height at an interface on the thin-film photoelectric conversion unit side is 500 nm or less. For example, by depositing a conductive oxide layer of zinc oxide or the like using a metal organic chemical vapor deposition method (MOCVD method), an intermediate transparent conductive layer filling recesses of the texture and covering the tops of projections of the texture on the light-receiving surface of the crystalline silicon-based photoelectric conversion unit can be formed. The intermediate transparent conductive layer may be formed by a wet method.

In one or more embodiments, a first conductive oxide layer may be deposited as the intermediate transparent conductive layer by an MOCVD method, and a heterogeneous layer may be formed on a surface thereof. The heterogeneous layer can be formed by, for example, depositing a second conductive oxide layer on the first conductive oxide layer by a sputtering method or the like. Alternatively, by subjecting the surface of the first conductive oxide layer to a plasma exposure treatment, the surface may be modified to form the heterogeneous layer. Examples of the plasma exposure treatment include reactive ion etching.

Since an intermediate transparent conductive layer fills recesses of a texture on a light-receiving surface of a crystalline silicon-based photoelectric conversion unit, a favorable thin-film coverage is exhibited even when a thin-film photoelectric conversion unit is formed by a wet method. Thus, an anti-reflection effect by the texture on the light-receiving surface of the crystalline silicon-based photoelectric conversion unit is exhibited, and also a high-quality thin-film photoelectric conversion unit is formed, so that a stacked photoelectric conversion device excellent in conversion characteristics can be provided.

DETAILED DESCRIPTION OF THE EMBODIMENTS

Figure 1:
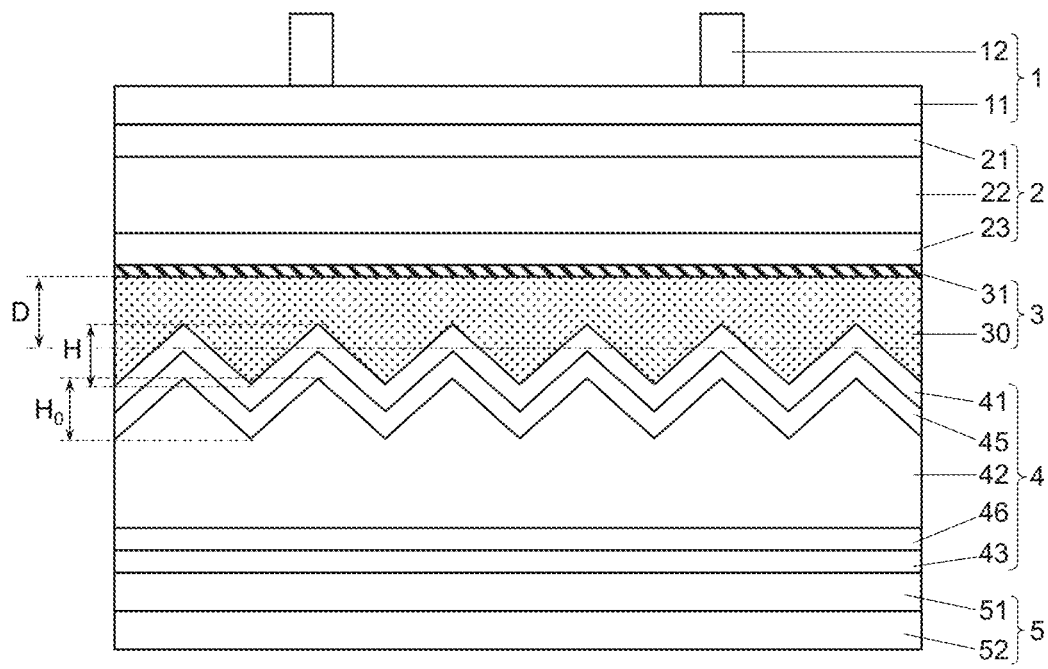
FIG. 1 is a sectional view of a stacked photoelectric conversion device according to one or more embodiments.

FIG. 1 is a schematic sectional view of a stacked photoelectric conversion device according to one or more embodiments of the present invention, and the upper side and the lower side in FIG. 1 correspond to the light-receiving side and the rear side, respectively. A photoelectric conversion device 100 includes a crystalline silicon-based photoelectric conversion unit 4 as a bottom cell. An intermediate transparent conductive layer 3 is disposed on a first principal surface (light-receiving side) of the bottom cell, and a thin-film photoelectric conversion unit 2 as a top cell is disposed thereon.

In one or more embodiments, the crystalline silicon-based photoelectric conversion unit 4 as a bottom cell includes a crystalline silicon substrate 42, and conductive silicon-based semiconductor layers 41 and 43 are disposed on the light-receiving side and the rear side, respectively, of the crystalline silicon substrate 42. The conductivity-type of the crystalline silicon substrate 42 may be either an n-type or a p-type. The first conductive silicon-based semiconductor layer 41 on the light-receiving side has a first conductivity-type, and the second conductive silicon-based semiconductor layer 43 on the rear side has a second conductivity-type. The first conductivity-type and the second conductivity-type are different conductivity-types, where one of the conductivity-types is a p-type, and the other is an n-type.

Examples of the crystalline silicon-based photoelectric conversion unit having a p-type semiconductor layer and an n-type semiconductor layer on a surface of a silicon substrate include diffusion-type crystalline silicon photoelectric conversion units and heterojunction-type crystalline silicon photoelectric conversion units. In the diffusion-type crystalline silicon photoelectric conversion unit, a doped impurity such as boron or phosphorus is diffused on a surface of the crystalline silicon substrate to form a conductive silicon-based semiconductor layer.

In the heterojunction-type crystalline silicon photoelectric conversion unit of one or more embodiments, a non-single-crystalline silicon-based thin-film of amorphous silicon, microcrystalline silicon or the like is disposed as each of the conductive silicon-based semiconductor layers 41 and 43, and a heterojunction is formed between the single-crystalline silicon substrate 42 and each of non-single-crystalline silicon-based thin films 41 and 43. The heterojunction-type crystalline silicon photoelectric conversion unit may include intrinsic silicon-based thin-films 45 and 46, each having a thickness of about 2 to 15 nm between the single-crystalline silicon substrate 42 and the conductive silicon-based thin-films 41 and 43, respectively By disposing an intrinsic silicon-based thin-film on a surface of a single-crystalline silicon substrate, surface passivation can be effectively performed while diffusion of impurities to the single-crystalline silicon substrate is suppressed.

As the conductive silicon-based thin-films 41 and 43, amorphous silicon, microcrystalline silicon (material including amorphous silicon and crystalline silicon), amorphous silicon alloy and microcrystalline silicon alloy may be used. Examples of the silicon alloy include silicon oxide, silicon carbide, silicon nitride silicon germanium and the like. Among the above, in some embodiments the conductive silicon-based thin-film may be preferably an amorphous silicon thin-film. In one or more embodiments, the thickness of each of the conductive silicon-based thin-films 41 and 43 may be preferably about 3 to 30 nm. The silicon-based thin films 41, 43, 45 and 46 may be preferably formed by a plasma enhanced CVD method.

In one or more embodiments, the crystalline silicon substrate 42 has a textured structure (morphology structure) on the light-receiving surface. By providing a texture on the surface, reflection of light at a surface of the silicon substrate 42 or at an interface on the light-receiving side of the crystalline silicon-based photoelectric conversion unit 4 with a thin-film formed on the silicon substrate can be reduced to increase the amount of light captured in the silicon substrate 42. A texture may also be provided on the rear side of the silicon substrate. The method for forming a texture on a surface of the crystalline silicon substrate is not particularly limited. For example, on a single-crystalline silicon substrate, a texture can be formed by anisotropic etching using an alkali.

In one or more embodiments, when the light-receiving surface of the crystalline silicon substrate 42 is textured, the light-receiving surface of the crystalline silicon-based photoelectric conversion unit 4 (at an interface with the intermediate transparent conductive layer 3) is also textured. When a conductive silicon-based semiconductor layer is formed by diffusion of a doped impurity to a surface of a silicon substrate as in a diffusion-type crystalline silicon cell, the morphology height of the texture on the light-receiving surface of the crystalline silicon-based photoelectric conversion unit 4 is equal to the morphology height of the texture on the silicon substrate 42. In the heterojunction cell, silicon-based thin-films 45 and 41 are disposed on the silicon substrate 42, and the thickness of each of the thin films is normally about 5 to 20 nm, and sufficiently smaller as compared to the morphology size of the silicon substrate 42. Thus, even when the thin-films 45 and 41 are disposed on the silicon substrate 42, the morphology height of the texture on the light-receiving surface of the crystalline silicon-based photoelectric conversion unit 4 is substantially equal to the morphology height of the texture on the silicon substrate 42.

In one or more embodiments, the average morphology height Ho of the texture formed on the light-receiving surface of the silicon substrate 42 and the average morphology height H of the texture on the light-receiving surface of the silicon-based photoelectric conversion unit 4 are each preferably 0.5 µm or more for reducing light reflection, and increasing the amount of captured light particularly having a long wavelength. The average morphology height of the texture is generally 10 µm or less. In one or more embodiments, the average morphology height Ho on the light-receiving surface of the crystalline silicon substrate 42 and the average morphology height H on the light-receiving surface of the crystalline silicon-based photoelectric conversion unit 4 are each preferably 2 µm or less for filling recesses of the texture with the intermediate transparent conductive layer 3 to smoothen an interface with the thin-film photoelectric conversion unit 2 formed thereon.

In one or more embodiments, a variation in morphology size of the texture may be preferably small for covering the texture with the intermediate transparent conductive layer 3 so that the tops of projections of the texture are not exposed. When a variation in morphology size of the texture is small, the difference between the average morphology height and the maximum morphology height is small. Thus, the tops of projections of the texture are hardly exposed from the surface of the intermediate transparent conductive layer, and leakage is accordingly suppressed. In one or more embodiments, the maximum morphology height on the light-receiving surface of the silicon substrate 42 and the maximum morphology height on the light-receiving surface of the crystalline silicon-based photoelectric conversion unit 4 are each preferably 4 µm or less, more preferably 3 µm or less, still more preferably 2.5 µm or less.

In one or more embodiments, the morphology height on the silicon substrate and the morphology height on the light-receiving surface of the crystalline silicon-based photoelectric conversion unit each correspond to a height difference between the top and the adjacent valley. The average morphology height is defined as being twice the arithmetic mean roughness Ra. The arithmetic mean roughness Ra is calculated in accordance with JIS B0601 (2001) from a roughness curve obtained by cross-sectional observation.

The maximum morphology height is a maximum value of morphology heights in observation regions (total 5 mm$^2$) in observation of a region of 1 mm$^2$ square at each of total five positions: at the central part in the surface of the substrate and in the vicinity of the corners of the substrate. The morphology height is determined by mapping distances in a normal direction to the substrate surface using an atomic force microscope or a laser microscope. When projections having a pyramidal shape (quadrangular pyramid including a square bottom and four regular triangles) are formed by anisotropic etching of the single-crystalline silicon substrate, projections having a pyramidal shape having a length a on each side have a constant height: $(a/\sqrt{2}) \approx 0.7a$. Thus, the morphology height of the texture can also be determined from an image of an observed surface by a scanning electron microscope, an optical microscope, or the like.

In one or more embodiments, the intermediate transparent conductive layer 3 is disposed on the texture on the crystalline silicon-based photoelectric conversion unit 4. The intermediate transparent conductive layer 3 disposed between the crystalline silicon-based photoelectric conversion unit 4 and the thin-film photoelectric conversion unit 2 has a function as a junction layer which recombines carriers produced in two photoelectric conversion units. The intermediate transparent conductive layer 3 transmits light arriving at the rear side of the thin-film photoelectric conversion unit 2, so that the light arrives at the crystalline silicon-based photoelectric conversion unit 4 disposed behind the intermediate transparent conductive layer 3. Thus, it may be preferable that the intermediate transparent conductive layer 3 has conductivity and is transparent. In one or more embodiments, the material for the intermediate transparent conductive layer 3 may be preferably a conductive oxide, and examples thereof include zinc oxide, indium oxide, tin oxide and composite oxides thereof. In one or more embodiments the refractive index of the intermediate transparent conductive layer 3 may be preferably 1.8 to 2.5 as described later.

In one or more embodiments, the intermediate transparent conductive layer 3 is disposed so as to fill recesses of the texture and cover the tops of projections of the texture on the light-receiving surface of the crystalline silicon-based photoelectric conversion unit 4. When a thin-film is deposited on the texture by a wet method, a solution is accumulated in recesses of the texture, so that the film is hardly formed at the tops of projections and in the vicinity thereof. Since the intermediate transparent conductive layer 3 is disposed so as to fill recesses of the texture and cover the tops of projections of the texture, favorable junction can be formed, and it is possible to suppress generation of a region where a film is not formed in formation of the thin-film photoelectric conversion unit 2 on the intermediate transparent conductive layer 3 by a wet method. In other words, the intermediate transparent conductive layer 3 acts as a flattening layer which reduces a height difference in the texture on the crystalline silicon-based photoelectric conversion unit. When the surface of the underlying intermediate transparent conductive layer 3 is flattened, a uniform thin-film can be formed in formation of thin-film photoelectric conversion unit 2 thereon by a wet method.

In one or more embodiments, the thickness D of the intermediate transparent conductive layer 3 may be preferably larger than the average morphology height of the texture on the light-receiving surface of the crystalline silicon-based photoelectric conversion unit 4. From the viewpoint of flattening the surface of the intermediate transparent conductive layer 3, so that the thin-film photoelectric conversion unit formed thereon has a uniform thickness, the thickness D of the intermediate transparent conductive layer 3 of one or more embodiments is more preferably not less than 1.5 times, still more preferably 2 times the average morphology height H of the texture on the light-receiving surface of the crystalline silicon-based photoelectric conversion unit 4. The thickness D of the intermediate transparent conductive layer 3 may be preferably 1 µm or more, more preferably 1.5 µm or more, still more preferably 2 µm or more, especially preferably 3 µm or more. For reliably covering the tops of projections of the texture, the thickness D of the intermediate transparent conductive layer 3 may be preferably larger than the maximum morphology height of the texture on the light-receiving surface of the crystalline silicon-based photoelectric conversion unit 4.

In one or more embodiments, when the intermediate transparent conductive layer 3 is formed by a wet method, the thickness D is calculated from the coating amount of a solution and the solid concentration. When the intermediate transparent conductive layer 3 is formed by a dry method, the thickness D is calculated from a product of the deposition rate and the deposition time. When the thickness of the intermediate transparent conductive layer 3 after deposition is measured, a distance between the average line of a roughness curve for the light-receiving surface of the crystalline silicon-based photoelectric conversion unit 4 and the average line of a roughness curve for the surface of the intermediate transparent conductive layer 3, which are obtained by cross-sectional observation, corresponds to the thickness of the intermediate transparent conductive layer 3.

When the thickness D of the intermediate transparent conductive layer 3 is excessively large, stress at an interface between the crystalline silicon-based photoelectric conversion unit 4 and the intermediate transparent conductive layer 3 may increase, leading to occurrence of warpage in the silicon substrate 42 due to imbalance between stress on the front side and stress on the rear side. Particularly when the intermediate transparent conductive layer 3 is composed of a crystalline transparent conductive oxide, substrate warpage associated with an increase in thickness D tends to increase. Thus, in one or more embodiments, the thickness D of the intermediate transparent conductive layer 3 may be preferably 10 µm or less, more preferably 8 µm or less, still more preferably 7 µm or less, especially preferably 6 µm or less. The thickness D of the intermediate transparent conductive layer 3 may be preferably not more than 20 times the average morphology height H of the texture.

The method for depositing the intermediate transparent conductive layer 3 is not particularly limited, and may be either a wet method or a dry method. Examples of the wet method of one or more embodiments include a method in which a transparent conductive film is formed by a sol-gel method or the like using a transparent conductive ink such as an ITO ink. Examples of the dry method of one or more embodiments include PVD methods such as a sputtering method, an ion plating method, an atomic layer deposition method, an electron beam vapor deposition method and a vacuum vapor deposition method, and CVD methods such as a plasma enhanced chemical vapor deposition (PECVD) method and a metal organic chemical vapor deposition (MOCVD) method.

In one or more embodiments, it may be preferable to form the intermediate transparent conductive layer 3 by a dry method because a transparent conductive oxide layer having low resistance can be formed. In particular, an MOCVD method may be preferable because the deposition rate is high. In a PVD method such as a sputtering method, a film is apt to grow in a normal direction to the substrate surface, whereas in a CVD method, a film is apt to grow in a normal direction to the inclined surface of the texture. Particularly, in an MOCVD method, a crystal tends to grow in a normal direction to the inclined surface of the texture, and therefore a film is apt to grow in a direction perpendicular to the inclined surface of the texture.

In one or more embodiments, when the film grows in a normal direction to the inclined surface of the texture, void portions of recesses of the texture are more easily filled even with a small deposition thickness as compared to a case where the film grows in a normal direction to the substrate surface. Thus, the surface is easily flattened by filling recesses of the texture with the intermediate transparent conductive layer 3 having a small thickness. When a conductive oxide film is formed as the intermediate transparent conductive layer 3 by an MOCVD method, the surface can be flattened with a small thickness, and therefore it can be expected to reduce the process time and production cost. In addition, the thickness D of the intermediate transparent conductive layer 3 can be reduced, and therefore warpage of the crystalline silicon substrate due to stress imbalance can be suppressed.

When the intermediate transparent conductive layer is deposited by an MOCVD method, there is an advantage that recesses of the texture can be filled with a small thickness, but the film quality of the thin-film photoelectric conversion unit formed thereon may be affected. For example, when a perovskite-type crystal material is deposited as a light absorbing layer 22 of the thin-film photoelectric conversion unit 2 by a wet method, a deposition failure such as phase separation may occur even when a semiconductor thin-film 23 such as an electron transport layer or a hole transport layer is disposed between the intermediate transparent conductive layer and the perovskite-type crystal material layer. It is considered that a residual organic substance or the like in deposition by an MOCVD is involved in such a deposition failure.

For forming the thin-film photoelectric conversion unit 2 having favorable film quality on the intermediate transparent conductive layer, it may be preferable to dispose a heterogeneous layer 31 as a second conductive oxide layer on the surface of a first conductive oxide layer 30 formed by an MOCVD method. The heterogeneous layer 31 is a layer including a material different from that of the first conductive oxide layer 30 filling recesses of the texture.

The different materials of one or more embodiments are materials which have different elemental compositions, or which have the same elemental composition but are different in properties such as crystallinity and density. Examples of the heterogeneous layer 31 include a transparent conductive oxide thin-film formed by a PVD method such as a sputtering method, and a modified layer obtained by forming a transparent conductive layer an MOCVD method followed by a plasma exposure to modify the surface of the transparent conductive layer.

A method of one or more embodiments for forming the intermediate transparent conductive layer 3 with the heterogeneous layer 31 disposed on a surface of the conductive oxide layer 30 formed by an MOCVD method will be described below.

In one or more embodiments, the conductive oxide layer 30 is formed by an MOCVD method. The material for the conductive oxide layer 30 is not particularly limited as long as it is a metal oxide which can be formed by an MOCVD method, and examples thereof include zinc oxide and tin oxide. When the crystalline silicon-based photoelectric conversion unit 4 such as a heterojunction cell includes a silicon-based thin-film, it may be preferable to perform deposition at a substrate temperature within a range over which the silicon-based thin-film has heat resistance (e.g., 200° C. or lower). In one or more embodiments, the material for the conductive oxide layer 30 is preferably zinc oxide because it can be deposited over the above-mentioned temperature range by an MOCVD method.

In one or more embodiments, deposition of a metal oxide layer by an MOCVD method is performed while an organic metal and an oxidizing agent are supplied into a CVD chamber under heating. For example, for deposition of zinc oxide, an alkyl zinc such as diethyl zinc or dimethyl zinc, a zinc acetate or the like is used as an organic metal. Diethyl zinc may be preferable because it has favorable reactivity with an oxidizing agent. As the oxidizing agent, water, oxygen, carbon dioxide, carbon monoxide, dinitrogen oxide, nitrogen dioxide, sulfur dioxide, dinitrogen pentaoxide, an alcohol, a ketone, an ether, an aldehyde, an amide, a sulfoxide or the like is used. In one or more embodiments, water is used as the oxidizing agent because it has favorable reactivity with an organic metal, and is conveniently handled.

In one or more embodiments, it may be preferable that in addition to an organic metal and an oxidizing agent, a diluting gas such as a rare gas, nitrogen or hydrogen is introduced into the CVD chamber. As the diluting gas, hydrogen may be preferable because it has a high heat conductivity, and is excellent in heat uniformity. A dopant may be used for improving the conductivity of the metal oxide. The dopant for zinc oxide may be a group 13 element such as B, Al or Ga, and as a dopant gas, diborane ($B_2H_6$), an alkyl aluminum, an alkyl gallium or the like is used. In particular, diborane may be preferable because it has a high doping efficiency for zinc oxide.

These raw material gases are reacted to deposit the conductive oxide layer 30 on the crystalline silicon-based photoelectric conversion unit 4. For promoting crystal growth of the conductive oxide, and growing a film in a normal direction to the inclined surface of the texture to fill recesses of the texture, in one or more embodiments it may be preferable that deposition by CVD is performed under heating. The substrate temperature during deposition of zinc oxide may be preferably 100 to 200° C., more preferably 120 to 190° C., still more preferably 130 to 180° C. The pressure in the chamber may be either normal pressure or reduced pressure. For forming an oxide film excellent in conductivity it may be preferable to perform deposition by a low-pressure thermal CVD method under a reduced pressure of for example, 5 to 100 Pa, preferably 5 to 40 Pa.

In one or more embodiments, the heterogeneous layer 31 is disposed on the surface of the conductive oxide layer 30 deposited by an MOCVD method. The heterogeneous layer 31 is a layer formed by a method different from the method for the conductive oxide layer 30 (i.e., a method other than MOCVD), or a surface modified layer of the conductive oxide layer 30. The material for the heterogeneous layer 31 may be identical to that for the conductive oxide layer 30. The amount of a residual organic substance in the heterogeneous layer 31 may be preferably smaller than that in the conductive oxide layer 30.

Examples of the method for depositing a heterogeneous layer by a method other than MOCVD include wet methods, various PVD methods and a plasma-enhanced CVD method. In particular, it may be preferable to form the heterogeneous layer 31 by a sputtering method because a dense film is easily formed. Formation of a dense film as the heterogeneous layer 31 is considered to suppress volatilization etc. of a residual organic substance from the conductive oxide layer 30 formed by an MOCVD method.

In a sputtering method of one or more embodiments, exposure of the deposition surface to a plasma is considered to contribute to modification of the intermediate transparent conductive layer. That is, modification of the surface of the conductive oxide layer 30 by deposition of the heterogeneous layer 31 by a sputtering method on the conductive oxide layer 30 formed by an MOCVD method is considered to contribute to reduction of influences on the thin-film photoelectric conversion unit formed on the intermediate transparent conductive layer 3.

In one or more embodiments, the material for the heterogeneous layer formed by a sputtering method is an indium-based oxide such as indium tin oxide (ITO), zinc oxide or the like. The thickness of the heterogeneous layer 31 is not particularly limited as long as it covers the surface of the conductive oxide layer 30 formed by an MOCVD method. For reliably covering the surface of the conductive oxide layer 30, the thickness of the heterogeneous layer 31 may be preferably 2 nm or more, more preferably 5 nm or more. An excessively large thickness of the heterogeneous layer 31 causes loss due to light absorption, or warpage due to an increase in stress, and therefore the thickness of the heterogeneous layer 31 may be preferably 100 nm or less, more preferably 50 nm or less.

In one or more embodiments, plasma exposure treatment may be preferable as a method for forming the heterogeneous layer 31 by modifying the surface of the conductive oxide layer 30. Examples of the plasma exposure treatment include a sputtering method, a plasma-enhanced CVD method and reactive ion etching. In the sputtering method, the type of a target, the power density and the like are adjusted to make the etching rate higher than the deposition rate, so that the surface of the conductive oxide layer 30 is subjected to plasma treatment. In the plasma-enhanced CVD method, a deposition raw material gas is not supplied, or the amount of a deposition raw material gas is decreased, and plasma discharge is performed while a diluting gas such as hydrogen is supplied, whereby the surface of the conductive oxide layer 30 is subjected to plasma treatment. In the reactive ion etching (RIE), an etching gas such as Ar is made plasmatic, so that sputtering by ions and chemical reaction by an etching gas occur at once, leading to modification of the surface.

Among the above-described plasma treatments, in one or more embodiments reactive ion etching may be preferable because a high surface modification effect is obtained. When the thickness is decreased by plasma treatment, the thickness of the conductive oxide layer decreases while the flatness of the surface is maintained, and therefore resistance in the thickness direction can be reduced. When the thickness is decreased by plasma treatment, it may be preferable to perform the treatment in such a manner that the thickness becomes equal to or less than 0.5 times the thickness before the plasma treatment.

In one or more embodiments, the morphology on a surface of the intermediate transparent conductive layer 3 on the light-receiving side (at an interface on the thin-film photoelectric conversion unit 2 side) may be preferably as small as possible. The average morphology height of the intermediate transparent conductive layer 3 is defined as being twice the arithmetic mean roughness Ra as in the case of the average morphology height of the crystalline silicon-based photoelectric conversion unit. The intermediate transparent conductive layer 3 fills recesses of the crystalline silicon-based photoelectric conversion unit to reduce the height difference on the light-receiving surface, whereby it is possible to improve the film quality of the thin-film photoelectric conversion unit 2 disposed on the intermediate transparent conductive layer 3.

In one or more embodiments, the average morphology height at an interface of the intermediate transparent conductive layer 3 on the thin-film photoelectric conversion unit 2 side may be preferably 500 nm or less, more preferably 250 nm or less, still more preferably 100 nm or less. As described above, when the thickness D of the intermediate transparent conductive layer 3 is increased, the morphology shape of the texture on the crystalline silicon-based photoelectric conversion unit 4 tends to be moderated, leading to a decrease in size of morphology on the intermediate transparent conductive layer 3.

On the light-receiving side of the intermediate transparent conductive layer 3 of one or more embodiments, the thin-film photoelectric conversion unit 2 is disposed as a top cell. The thin-film photoelectric conversion unit 2 includes a rear side semiconductor layer 23, the light absorbing layer 22 and a light-receiving side semiconductor layer 21 in this order from the intermediate transparent conductive layer 3 side. At least a part of the thin-film photoelectric conversion unit 2 is deposited by a wet method.

In one or more embodiments, a functional layer (not shown) aimed at improvement of contact, adjustment of the refractive index, or the like may be disposed between the intermediate transparent conductive layer 3 and the thin-film photoelectric conversion unit 2. On the other hand, when the intermediate transparent conductive layer 3 and the heterogeneous layer 31 disposed on a surface thereof also have the functions of the rear side semiconductor layer, the light absorbing layer 22 may be formed in contact with the intermediate transparent conductive layer 3.

In one or more embodiments, the light absorbing layer 22 of the thin-film photoelectric conversion unit 2 is a layer which absorbs sunlight to produce photoinduced carriers, and the light absorbing layer 22 includes a material having a bandgap wider than that of crystalline silicon. Examples of the thin-film material having a bandgap wider than that of crystalline silicon include amorphous silicon-based materials such as amorphous silicon and amorphous silicon carbide, perovskite-type crystal materials, and various organic semiconductor materials.

In one or more embodiments, when the thin-film photoelectric conversion unit 2 and the crystalline silicon-based photoelectric conversion unit 4 are connected in series, the light-receiving side semiconductor layer 21 of the thin-film photoelectric conversion unit 2 has a conductivity-type identical to that of the first conductive silicon-based semiconductor layer 41 of the crystalline silicon-based photoelectric conversion unit 4, and the rear side semiconductor layer 23 has a conductivity-type identical to that of the second conductive silicon-based semiconductor layer 43. For example, when the first conductive silicon-based thin-film 41 has p-type conductivity, and the second conductive silicon-based thin-film 43 has n-type conductivity, the light-receiving side semiconductor layer 21 has p-type conductivity, and the rear side semiconductor layer 23 has n-type conductivity. On the other hand, when the thin-film photoelectric conversion unit 2 and the crystalline silicon-based photoelectric conversion unit 4 are stacked so as to have opposite rectification properties, both the units are connected in parallel.

In one or more embodiments, when the light-receiving side semiconductor layer 21 and the rear side semiconductor layer 23 are organic semiconductor layers, the layers are considered to have n-type conductivity when having an electron transport property and considered to have p-type conductivity when having a hole transport property. For example, the first conductive silicon-based thin-film 41 of the crystalline silicon-based photoelectric conversion unit 4 has p-type conductivity the second conductive silicon-based thin-film 43 has n-type conductivity, and the thin-film photoelectric conversion unit 2 is a perovskite photoelectric conversion unit using a perovskite-type crystal material as the light absorbing layer 22, the crystalline silicon-based photoelectric conversion unit and the perovskite photoelectric conversion unit are connected in series when the light-receiving side semiconductor layer 21 is a hole transport layer, and the rear side semiconductor layer 23 is an electron transport layer.

In one or more embodiments, at least one of the rear side semiconductor layer 23, the light absorbing layer 22 and the light-receiving side semiconductor layer 21 that form the thin-film photoelectric conversion unit 2 is formed by a wet method. A texture is formed on a surface of the silicon substrate 42 serving as a base for formation of the thin-film photoelectric conversion unit 2, and when the intermediate transparent conductive layer 3 is disposed thereon so as to fill recesses of the texture, a thin-film having a favorable coverage can be deposited by a wet method.

One or more embodiments will be described below in which the thin-film photoelectric conversion unit 2 is a perovskite photoelectric conversion unit which includes a perovskite-type crystal material as the light absorbing layer 22 and which includes a p-layer (hole transport layer) on the light-receiving side and an n-layer (electron transport layer) on the rear side of the light absorbing layer 22. In this embodiment, the electron transport layer 23, the perovskite light absorbing layer 22 and the hole transport layer 21 are arranged in this order on the intermediate transparent conductive layer 3 to form the perovskite photoelectric conversion unit 2.

As a material of the electron transport layer 23 of one or more embodiments, inorganic materials such as titanium oxide, zinc oxide, niobium oxide, zirconium oxide and aluminum oxide are preferred. An organic material such as a fullerene-based material typified by PCBM, or a perylene-based material can also be used as a material of the electron transport layer. The electron transport layer may contain a donor. For example, when titanium oxide is used for the electron transport layer, examples of the donor include yttrium, europium and terbium.

In one or more embodiments, the perovskite light absorbing layer 22 contains a perovskite-type crystal structure photosensitive material (perovskite crystal material). The compound that forms the perovskite crystal material is represented by, for example, a general formula of $RNH_3MX_3$ or $HCH(NH_2)_2MX_3$. In the formula, R may be an alkyl group, preferably an alkyl group having 1 to 5 carbon atoms, especially preferably a methyl group. M is a divalent metal ion, preferably Pb or Sn. X is a halogen and examples thereof include F, Cl, Br and I. All three Xs may be the same halogen element, or include a plurality of halogens. The spectral sensitivity characteristic can be adjusted by changing the type and ratio of the halogen.

The wavelength range of light absorbed by the perovskite light absorbing layer 22 is determined by the bandgap of the perovskite-type crystal material. In one or more embodiments, the bandgap of the perovskite light absorbing layer 22 may be preferably 1.55 to 1.75 eV more preferably 1.6 to 1.65 eV for making current matching between the perovskite photoelectric conversion unit 2 and the crystalline silicon-based photoelectric conversion unit 4. For example, when the perovskite crystal material is represented by the formula $CH_3NH_3PbI_{3-y}Br_y$, y may be preferably about 0 to 0.85 for ensuring that the bandgap is 1.55 to 1.75 eV and y may be preferably about 0.15 to 0.55 for ensuring that the bandgap is 1.60 to 1.65 eV.

In one or more embodiments, organic materials are preferable for the hole transport layer 21, and examples thereof include polythiophene derivatives such as poly-3-hexylthiophene (P3HT) and poly(3,4-ethylenedioxythiophene) (PEDOT); fluorene derivatives such as 2,2',7,7'-tetrakis-(N,N-di-p-methoxyphenylamine)-9,9'-spirobifluorene (Spiro-OMeTAD); carbazole derivatives such as polyvinyl carbazole; triphenylamine derivatives; diphenylamine derivatives such as poly(bis(4-phenyl)(2,4,6-trimethylphenyl)amine) (PTAA); diphenylamine derivatives; polysilane derivatives; polyaniline derivatives; and complex of porphyrin, phthalocyanine, etc. Inorganic oxides such as $MoO_3$, $WO_3$, NiO and CuO may also be used as the material of the hole transport layer, and the inorganic oxide may be stacked with an organic material.

The method for depositing the electron transport layer 23, the light absorbing layer 22 and the hole transport layer 21 of the perovskite photoelectric conversion unit is not particularly limited, a dry method such as a vacuum vapor deposition method, a CVD method or a sputtering method, or a wet method such as a spin coating method, a spraying method or a bar coating method can be employed according to the propertied of materials, etc. At least one of the layers is deposited by a wet method.

For example, when $CH_3NH_3PbI_3$ is deposited as the perovskite light absorbing layer 22, a solution obtained by mixing lead iodide and methyl ammonium iodide in a solvent such as dimethyl sulfoxide or N,N-dimethylformamide is applied by a spin coating method, and the coating film is heated to grow a $CH_3NH_3PbI_3$ crystal. Crystallinity can be improved by bringing a poor solvent into contact with the surface of the coating film.

Since the intermediate transparent conductive layer 3 is disposed on the crystalline silicon-based photoelectric conversion unit 4 having a texture on the light-receiving surface, in one or more embodiments an underlay in deposition of the perovskite light absorbing layer 22 etc. is flattened. Thus, liquid accumulation in texture recesses hardly occurs, so that a thin-film having higher uniformity can be formed by a wet method. Since the intermediate transparent conductive layer 3 has the heterogeneous layer 31 on the surface of the conductive oxide layer 30 formed by an MOCVD method, adverse influences such as phase separation ascribable to the underlay hardly occur even when the perovskite-type crystal material is formed by a wet method.

In one or more embodiments, the perovskite-type crystal material layer may be formed by a combination of a dry method and a wet method. For example, a thin-film of lead iodide is formed by a vacuum vapor deposition method, a solution of methyl ammonium iodide in isopropyl alcohol is applied to the surface thereof by a spin coating method to obtain a crystal of $CH_3NH_3PbI_3$. Since the intermediate transparent conductive layer 3 is disposed so as to fill recesses of the texture, accumulation of the solution applied by a wet method such as spin coating in the recesses is suppressed, so that the perovskite-type crystal material layer can be uniformly formed.

Thus, according to one or more embodiments of the present invention, even when a crystalline silicon substrate having a texture on the light-receiving surface is used for the crystalline silicon-based photoelectric conversion unit 4, a thin-film having high uniformity can be deposited thereon by a wet method. Thus, an anti-reflection effect by the texture on the light-receiving surface of the crystalline silicon-based photoelectric conversion unit 4 is exhibited, and also the high-quality thin-film photoelectric conversion unit 2 is formed, so that a stacked photoelectric conversion device excellent in conversion characteristics is obtained.

In one or more embodiments, a light-receiving surface electrode 1 includes a transparent electrode layer 11. It may be preferable to use a conductive oxide such as zinc oxide, tin oxide or indium oxide or a composite oxide such as indium tin oxide (ITO) as a material for the transparent electrode layer. In addition, a material obtained by doping $In_2O_3$ or $SnO_2$ with W, Ti or the like may be used. Such a transparent conductive oxide has transparency and low resistance, and is therefore capable of efficiently collecting photoinduced carriers. The method for depositing the transparent electrode layer may be preferably a sputtering method or an MOCVD method. For the transparent electrode layer, not only an oxide, but also a metal thin wire such as an Ag nanowire, or an organic material such as PEDOT-PSS can be used.

In one or more embodiments, the light-receiving surface electrode 1 may have a patterned metal electrode 12 on the transparent electrode layer 11. The pattern shape of the metal electrode 12 disposed on the light-receiving surface is typically a grid shape, e.g., a grid shape formed by a plurality of finger electrodes arranged in parallel and bus bar electrodes extending in a direction orthogonal to the finger electrodes.

When a metal oxide such as ITO is used as the transparent electrode layer 11 on the light-receiving side, in one or more embodiments it may be preferable to dispose an anti-reflection film (not shown) on the outermost surface of the light-receiving surface. When an anti-reflection film composed of a material having a low refractive index, such as MgF is disposed on the outermost surface, the refractive index difference at an air interface can be decreased to reduce light reflection, leading to an increase in the amount of light captured in the photoelectric conversion unit.

In one or more embodiments, a rear electrode 5 may be either a transparent electrode or a metal electrode, or an electrode obtained by stacking a transparent electrode and a metal electrode. When the crystalline silicon-based photoelectric conversion unit 4 is a heterojunction-type crystalline silicon photoelectric conversion unit, a transparent electrode layer 51 is disposed in contact with the semiconductor layer 43, and a metal electrode 52 is disposed thereon. It may be preferable that a material as exemplified above as a material for the transparent electrode layer 11 on the light-receiving side is used as a material for the transparent electrode layer 51 on the rear side.

In one or more embodiments, the rear metal electrode 52 may be formed over the entire surface, or in a pattern shape. It is desirable that a material having a high reflectance to light having a long wavelength, and high conductivity and chemical stability be used for the rear metal electrode 52. Examples of the material having the above-mentioned characteristics include silver, copper and aluminum. The rear electrode can be formed by a printing method, various physical vapor deposition methods, a plating method or the like.

As described above, on the crystalline silicon-based photoelectric conversion unit 4 having a texture on the light-receiving surface, the intermediate transparent conductive layer 3 is disposed so as to fill recesses of the texture, and thereon, a perovskite photoelectric conversion unit is formed as the thin-film photoelectric conversion unit 2. In this configuration, the surface of the intermediate transparent conductive layer is flattened, and therefore it is possible to form a perovskite photoelectric conversion unit which has high film quality, and is excellent in uniformity.

Further, due to the anti-reflection effect by the texture on the light-receiving surface of the silicon substrate, the amount of light captured in the crystalline silicon substrate increases, leading to an increase in the amount of current generated in the crystalline silicon-based photoelectric conversion unit. Not only formation of the texture on the light-receiving surface but also formation of the intermediate transparent conductive layer 3 so as to fill recesses of the texture contributes to an increase in the amount of current generated in the crystalline silicon-based photoelectric conversion unit.

In a stacked photoelectric conversion device of one or more embodiments in which a plurality of photoelectric conversion units are connected in series, the current value is limited by a photoelectric conversion unit with a small current. The perovskite-type crystal material has a large absorption coefficient for short-wavelength light having high energy, and therefore in a stacked photoelectric conversion device including a perovskite photoelectric conversion unit on a crystalline silicon-based photoelectric conversion unit, the current value in the crystalline silicon-based photoelectric conversion unit determines the overall current value. Thus, an increase in the amount of current generated in the crystalline silicon-based photoelectric conversion unit as a bottom cell is directly linked to an increase in the amount of current generated in the stacked photoelectric conversion device.

Figure 2:
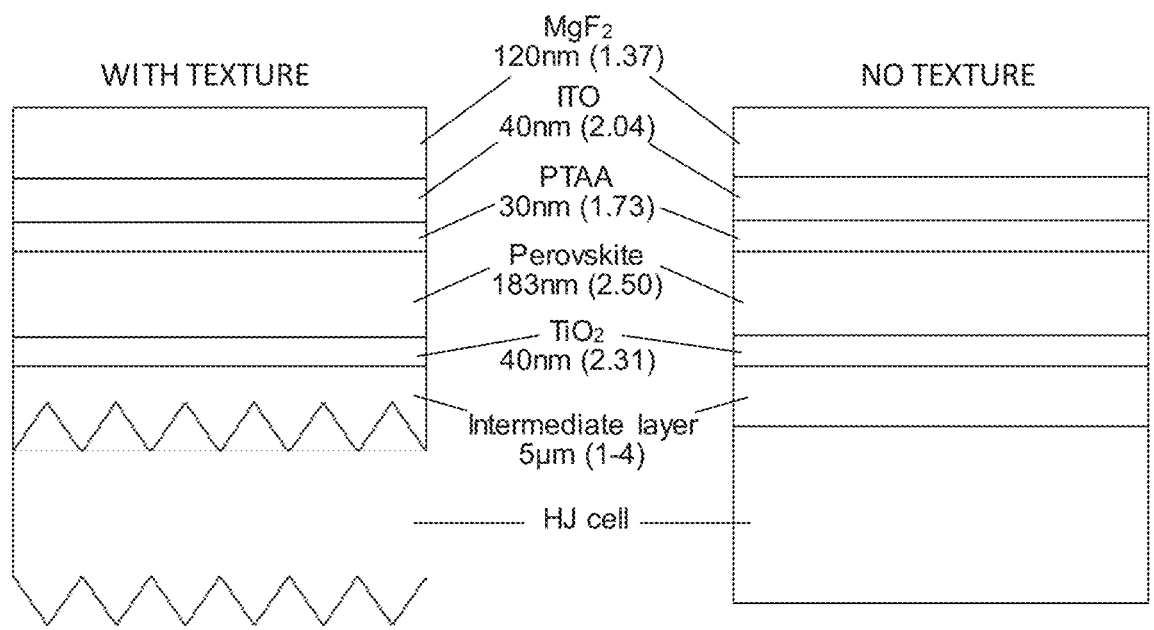
FIG. 2 is a schematic diagram of a configuration of a stacked photoelectric conversion device used in optical simulation.

FIG. 2 shows an example of a stacking configuration of a stacked photoelectric conversion device in which a perovskite photoelectric conversion unit is arranged on a heterojunction-type crystalline silicon photoelectric conversion unit (HJ cell) with an intermediate layer interposed therebetween, where the illustration on the left shows one or more embodiments in which a texture is provided on the crystalline silicon substrate, and the illustration on the right shows a mode in which a texture is not provided on the crystalline silicon substrate. The values given in parentheses in the drawing indicate the refractive indices of the materials at a wavelength of 590 nm.

Figure 3:
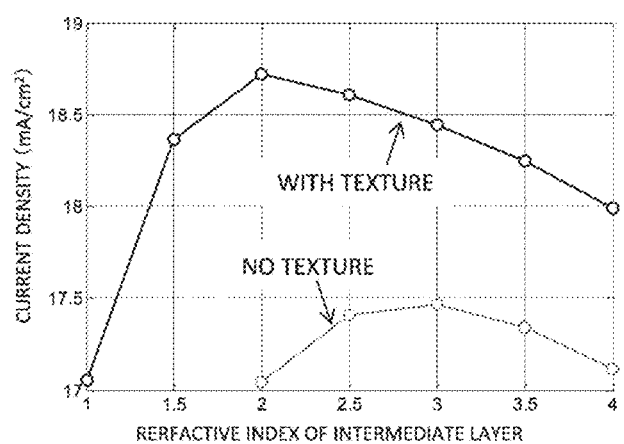
FIG. 3 is a diagram showing the results of optical simulation.

FIG. 3 shows the results of calculating the current density of a heterojunction cell while the refractive index of the intermediate layer is changed within a range of 1 to 4 in a stacked photoelectric conversion device having the configuration in FIG. 2. The results show that irrespective of the value of the refractive index of the intermediate layer, the current density of the heterojunction cell is increased when a texture is provided.

When a texture is not provided on the surface of the silicon substrate, in one or more embodiments the current density of the heterojunction cell is maximum when the refractive index of the intermediate layer is about 3. On the other hand, it is apparent that when a texture is provided on the surface of the silicon substrate, the current density of the heterojunction cell is maximum when the refractive index of the intermediate layer is about 2. The simulation results show that when a texture is not provided on the surface of the silicon substrate, the refractive index of the intermediate layer may be preferably about 3, and when a texture is provided on the surface of the silicon substrate, and an intermediate layer is formed so as to fill recesses of the texture, the refractive index of the intermediate layer may be preferably about 2.

Particularly when the refractive index of the intermediate layer filling recesses of the texture is in a range of about 1.8 to 2.5, the heterojunction cell tends to have a high current density. Many of conductive oxides such as zinc oxide have a refractive index within the above-mentioned range, and therefore by disposing the intermediate transparent conductive layer so as to fill recesses of the texture, limitation of current by the bottom cell is relaxed, so that a stacked photoelectric conversion device having high conversion efficiency is obtained.

Preferably, in one or more embodiments the stacked photoelectric conversion device may be modularized in practical use. Modularization is performed by, for example, encapsulating a cell between a substrate and a back sheet with an encapsulant interposed between the cell and the substrate and between the cell and the back sheet. A plurality of cells may be connected in series or in parallel through an interconnector, and then encapsulated.

EXAMPLES

One or more embodiments of the present invention will be described more in detail by way of comparison of examples with a comparative example, but embodiments of the present invention are not limited to the following examples.

Comparative Example (Preparation of Silicon Cell)

An n-type single-crystalline silicon substrate having a thickness of 200 μm was immersed in an alkali solution to subject both surfaces of the silicon substrate to anisotropic etching, so that a pyramidal texture on which the (111) plane is exposed was formed on both surfaces of the substrate. The average morphology height of the texture was 1.5 μm. The silicon substrate after etching was introduced into a CVD apparatus, and an intrinsic amorphous silicon thin-film and a p-type amorphous silicon thin-film were deposited by plasma-enhanced CVD.

(Deposition of Perovskite-Type Crystal Material Layer)

A titanium oxide layer having a thickness of 50 nm was deposited as an electron transport layer of a perovskite cell on a p-type amorphous silicon thin-film by an electron beam vapor deposition method. The deposition surface was observed with a scanning electron microscope (SEM), and the result showed that a titanium oxide layer was uniformly deposited over the entire surface of the crystalline silicon cell having a texture.

A solution of lead iodide and methyl ammonium iodide in dimethyl sulfoxide was applied onto the titanium oxide layer by a spin coating method so as to have a dry thickness of 350 nm. The surface was observed with SEM after heating was performed at 100° C. for 10 minutes, and the result showed that a coating film was not formed on projections of the texture, and the underlying titanium oxide layer was exposed.

Reference Examples 1 to 3: Formation of Zinc Oxide Intermediate Layer on Texture In the same manner as in Comparative Example 1, an intrinsic amorphous silicon thin-film and a p-type amorphous silicon thin-film were deposited by plasma-enhanced CVD on a silicon substrate provided with a texture. Diethyl zinc (($C_2H_5$)$_2$Zn), water ($H_2O$), hydrogen ($H_2$), and diborane ($B_2H_8$) diluted to 0.5% with hydrogen were introduced at a flow rate ratio of 1:1.5:1.5:1.5 at a substrate temperature of 150° C., and zinc oxide was deposited onto the p-type amorphous silicon thin-film at a pressure of 25 Pa by MOCVD. The thickness of zinc oxide was set to 1.7 μm (Reference Example 1), 2.9 μm (Reference Example 2) and 4.8 μm. The thickness is a calculated value based on a deposition rate determined from the thickness of a zinc oxide layer deposited on a flat silicon substrate under the same conditions.

Figure 4:
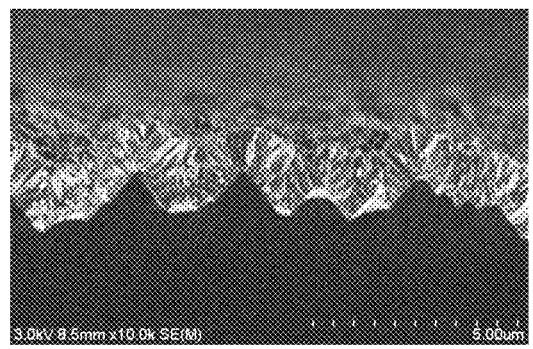
FIG. 4 is an SEM image of a cross-section of a zinc oxide film formed on a silicon substrate having a texture.
Figure 4:
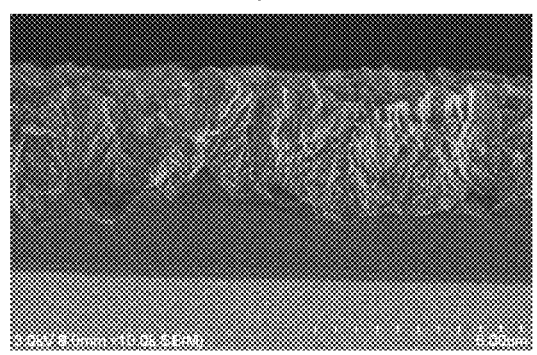
Figure 4:
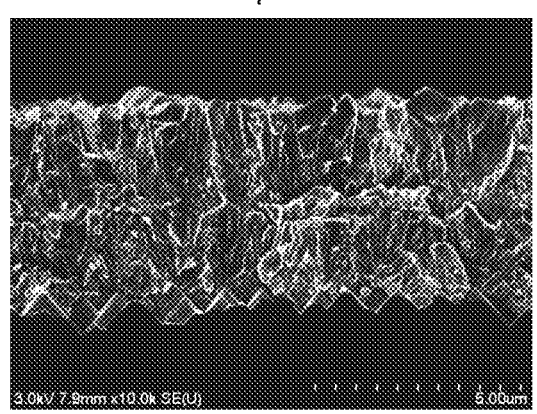

FIG. 4 shows SEM images of cross-sections of zinc oxide films in Reference Examples 1 to 3. It is apparent that in each of Reference Examples 1 to 3, a crystal grows in a normal direction to the inclined surface of the texture in the initial stage of deposition of zinc oxide (below the observation image; interface on the silicon substrate side), so that recesses of the texture are filled to flatten the surface.

Although the surface of the zinc oxide film in Reference Example 1 (1.7 μm) had a morphology pattern following the morphology of the texture on the silicon substrate, the height difference of the morphology was reduced. In Reference Example 2 (2.9 μm) and Reference Example 3 (4.8 μm), the surface of the zinc oxide film did not have a morphology shape resulting from the morphology on the silicon substrate. In Reference Example 3, the surface of the zinc oxide film had a morphology shape resulting from crystal growth.

Reference Example 4: Deposition of
Perovskite-Type Crystal Material Layer on
Intermediate Layer In the same manner as in Reference Example 2, an intrinsic amorphous silicon thin-film and a p-type amorphous silicon thin-film were deposited by plasma-enhanced CVD on a silicon substrate provided with a texture, and zinc oxide having a thickness of 2.9 μm was deposited thereon by an MOCVD method. In the same manner as in Comparative Example 1, a titanium oxide layer having a thickness of 50 nm was deposited on the zinc oxide layer, and a solution of lead iodide and methyl ammonium iodide was applied thereon, and heated.

Example 1: Formation of Sputtered Film and
Deposition of Perovskite-Type Crystal Material
Layer on Intermediate Layer In the same manner as in Reference Example 4, an intrinsic amorphous silicon thin-film and a p-type amorphous silicon thin-film were deposited by plasma-enhanced CVD on a silicon substrate provided with a texture, and zinc oxide having a thickness of 2.9 μm was deposited thereon by an MOCVD method. ITO having a thickness of 100 nm was deposited on a zinc oxide layer at room temperature by DC magnetron sputtering. In the same manner as in Comparative Example 1, a titanium oxide layer having a thickness of 50 nm was deposited on the ITO layer, and a solution of lead iodide and methyl ammonium iodide was applied thereon, and heated.

Figure 5:
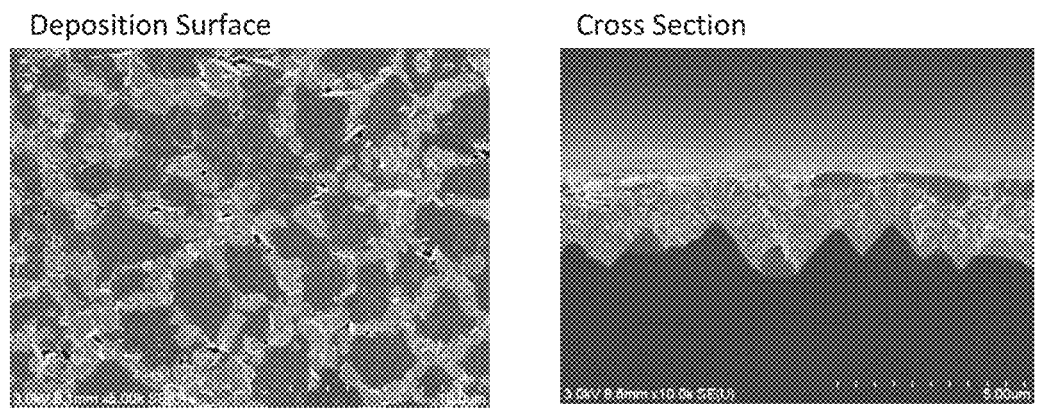
FIG. 5 shows SEM observation images of a deposition surface and a cross-section in Reference Example 4.
Figure 6:
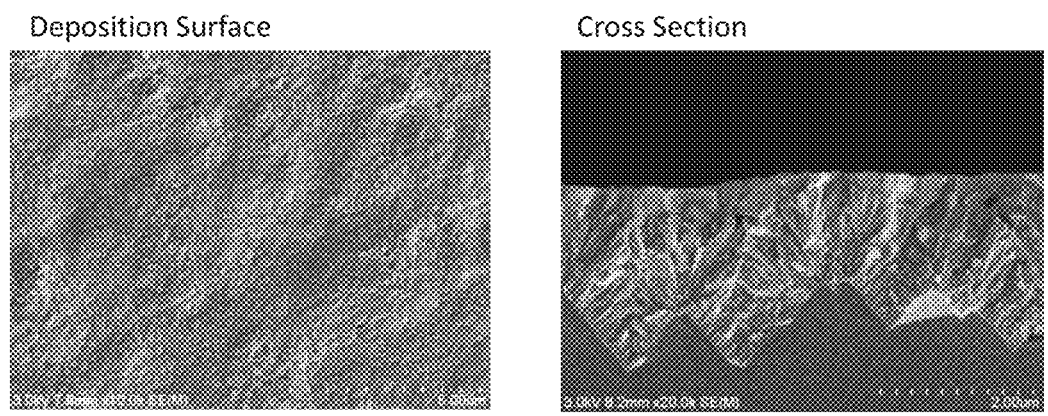
FIG. 6 shows SEM observation images of a deposition surface and a cross-section in Example 1.

FIG. 5 shows SEM observation images of a deposition surface and a cross-section in Reference Example 4. FIG. 6 shows SEM observation images of a deposition surface and a cross-section in Example 1. In Reference Example 1, the entire surface was covered, and the underlying titanium oxide layer was not exposed, but the film was nonuniform due to phase separation as shown in the SEM image of the deposition surface in FIG. 5. On the other hand, a uniform film was formed in Example 1 where an ITO film was formed on a zinc oxide film by a sputtering method.

Figure 7:
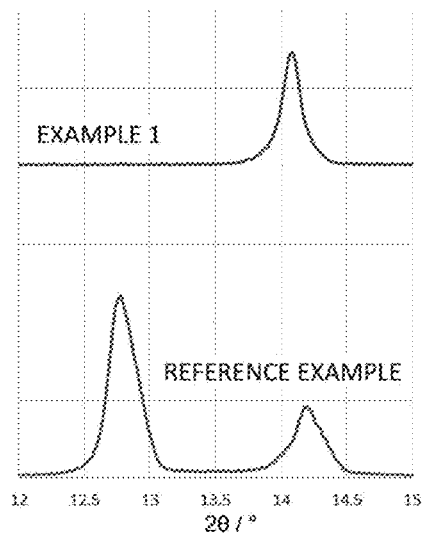
FIG. 7 shows an X-ray diffraction diagram of the coating layer on the surface in each of Reference Example 4 and Example 1.

FIG. 7 shows an X-ray diffraction diagram of the coating layer on the surface in each of Reference Example 4 and Example 1. In Example 1, a peak was observed at 2θ=14.1°, and thus it was possible to confirm that a crystal of $CH_3NH_3PbI_3$ was formed. It is apparent that in Reference Example 4, a perovskite crystal was not sufficiently formed, and phase separation occurred because a peak of lead iodide at 2θ=12.8° was observed in addition to a peak of $CH_3NH_3PbI_3$ at 2θ=14.2°.

Example 2

Figure 8:
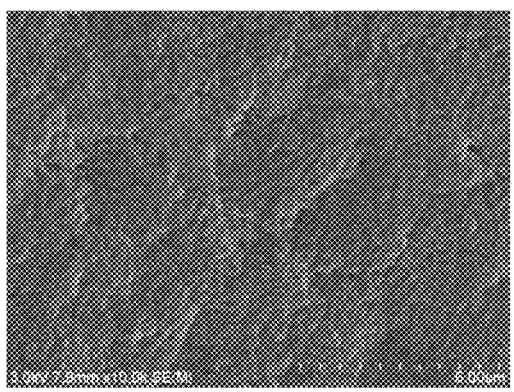
FIG. 8 is a SEM observation image of a deposition surface of Example 2.

Except that the thickness of the ITO layer on the zinc oxide layer was changed to 5 nm, the same procedure as in Example 1 was carried out to deposit each layer. FIG. 8 shows a SEM observation image of a deposition surface. Even when the thickness of the ITO layer was 5 nm, a uniform perovskite crystal material film was formed as in the case of Example 1 in which the thickness of the ITO layer was 100 nm.

Figure 9:
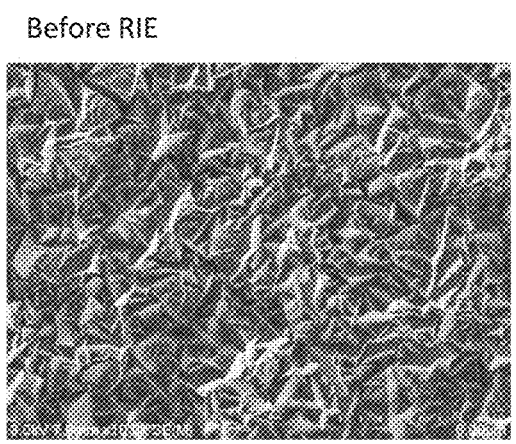
FIG. 9 shows SEM observation images of oxide zinc film surface before and after RIE.
Figure 9:
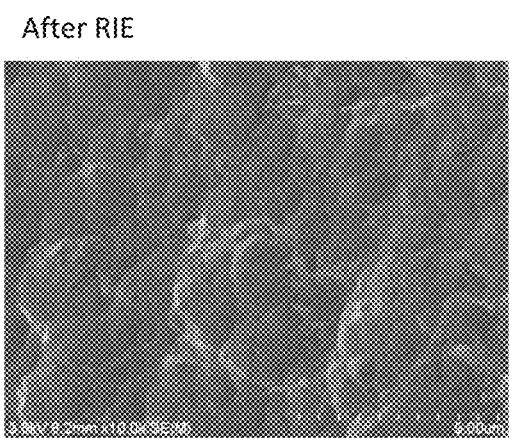

Example 3: RIE Treatment of Intermediate Layer
and Deposition of Perovskite-Type Crystal Material
Layer In the same manner as in Reference Example 4, an intrinsic amorphous silicon thin-film and a p-type amorphous silicon thin-film were deposited by plasma-enhanced CVD on a silicon substrate provided with a texture, and zinc oxide having a thickness of 2.2 μm was deposited thereon by an MOCVD method. The zinc oxide deposition surface was subjected to reactive ion etching (RIE) to modify the surface. FIG. 9 shows a SEM observation image of the oxide zinc film surface before and after RIE.

Figure 10:
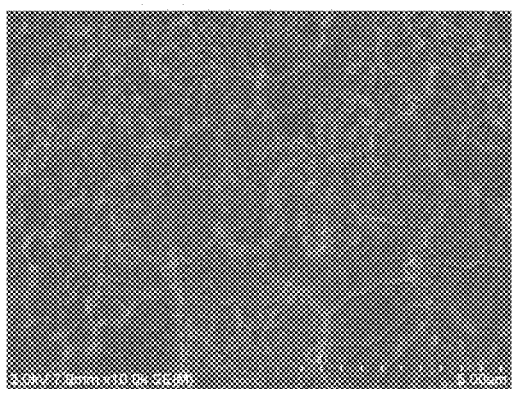
FIG. 10 shows a SEM observation image of a deposition surface of Example 3.

In the same manner as in Comparative Example 1, a titanium oxide layer having a thickness of 50 nm was deposited on the zinc oxide layer after RIE, and a solution of lead iodide and methyl ammonium iodide was applied thereon, and heated. FIG. 10 shows a SEM observation image of a deposition surface. Even when the surface was treated by RIE, a uniform film was formed as in the case of Examples 1 and 2.

Figure 11:
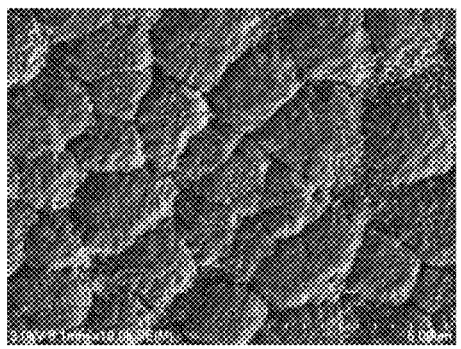
FIG. 11 shows SEM observation images of a deposition surface and a cross-section in Example 4.
Figure 11:
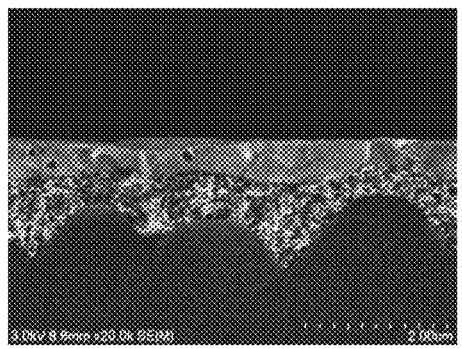

Example 4: Deposition of Perovskite-Type Crystal
Material Layer on Coating-Type Conductive
Intermediate Layer In the same manner as in Comparative Example 1, an intrinsic amorphous silicon thin-film and a p-type amorphous silicon thin-film were deposited by plasma-enhanced CVD on a silicon substrate provided with a texture. An ITO ink was applied onto the p-type amorphous silicon thin-film so as to have a thickness of 1 μm after drying, and heated at 180° C. for 30 minutes to solidify the coating layer. In the same manner as in Comparative Example 1, a titanium oxide layer having a thickness of 50 nm was deposited on the ITO layer, and a solution of lead iodide and methyl ammonium iodide was applied thereon, and heated. FIG. 11 shows SEM observation images of a deposition surface and a cross-section. Even in Example 4 using a coating-type conductive layer as an intermediate layer, a uniform film was formed as in the case of Examples 1 to 3.

Although the disclosure has been described with respect to only a limited number of embodiments, those skilled in the art, having benefit of this disclosure, will appreciate that various other embodiments may be devised without departing from the scope of the present invention. Accordingly the scope of the invention should be limited only by the attached claims.

DESCRIPTION OF REFERENCE SIGNS

1 Light-receiving surface electrode
2 Thin-film photoelectric conversion unit
22 Light absorbing layer
21, 23 Semiconductor layer
3 Intermediate transparent conductive layer
30 Conductive oxide layer
31 Heterogeneous layer
4 Crystalline silicon-based photoelectric conversion unit
42 Crystalline silicon substrate
41, 43 Semiconductor layer
5 Rear electrode

What is claimed is:

1. A method for manufacturing a stacked photoelectric conversion device, the method comprising:
    forming an intermediate transparent conductive layer on a light-receiving surface of a crystalline silicon-based photoelectric conversion unit comprising a crystalline silicon substrate; and
    forming a thin-film photoelectric conversion unit on the intermediate transparent conductive layer,
    wherein the stacked photoelectric conversion device comprises:
        the crystalline silicon-based photoelectric conversion unit;
        the intermediate transparent conductive layer; and
        the thin-film photoelectric conversion unit,
    wherein the light-receiving surface of the crystalline silicon-based photoelectric conversion unit has a textured surface comprising a plurality of projections and recesses,
    wherein the textured surface has an average height of 0.5 µm or more,
    wherein the intermediate transparent conductive layer completely fills the recesses of the textured surface and covers the tops of the projections of the textured surface, and
    wherein at least a part of the thin-film photoelectric conversion unit is deposited by a wet method.

2. The method according to claim 1, wherein the intermediate transparent conductive layer has a surface adjacent to the thin-film photoelectric conversion unit having an average height of 500 nm or less.

3. The method according to claim 1, wherein forming the intermediate transparent conductive layer comprises:
    depositing a first conductive oxide layer by a metal organic chemical vapor deposition (MOCVD) method; and
    forming a heterogeneous layer on a surface of the first conductive oxide layer,
    wherein the first conductive oxide layer fills the recesses and covers the tops of the projections.

4. The method according to claim 3, wherein forming the heterogeneous layer comprises depositing a second conductive oxide layer on the first conductive oxide layer by a sputtering method.

5. The method according to claim 3, wherein forming the heterogeneous layer comprises subjecting the surface of the first conductive oxide layer to a plasma exposure.

6. The method according to claim 5, wherein the plasma exposure is performed by reactive ion etching.

7. The method according to claim 3, wherein the first conductive oxide layer is a zinc oxide.

8. The method according to claim 1, wherein the intermediate transparent conductive layer is formed by a wet method.

9. The method according to claim 1, wherein the average height is of 0.5 to 2 µm.

10. The method according to claim 1, wherein the thin-film photoelectric conversion unit contains a perovskite-type crystal material.

11. The method according to claim 1, wherein the intermediate transparent conductive layer has a surface adjacent to the thin-film photoelectric conversion unit having an average height of 250 nm or less.

12. The method according to claim 1, wherein a thickness of the intermediate transparent conductive layer is larger than a maximum height of the textured surface of the crystalline silicon-based photoelectric conversion unit.

13. The method according to claim 12, wherein a thickness of the intermediate transparent conductive layer is 1 µm or more.

14. The method according to claim 12, wherein a thickness of the intermediate transparent conductive layer is 1.5 µm or more.

15. The method according to claim 1, wherein a thickness of the intermediate transparent conductive layer is 1 µm or more.

16. The method according to claim 1, wherein a thickness of the intermediate transparent conductive layer is 1.5 µm or more.

* * * * *